United States Patent [19]

Ishida et al.

[11] Patent Number: 5,739,588
[45] Date of Patent: Apr. 14, 1998

[54] SEMICONDUCTOR DEVICE

[75] Inventors: Yoshihiro Ishida; Yoshinobu Ohmori; Ienobu Ikeda, all of Tanashi; Kazuhiko Terashima; Takeshi Toyoda, both of Tokorozawa, all of Japan

[73] Assignee: Citizen Watch Co., Ltd., Tokyo, Japan

[21] Appl. No.: 624,496

[22] PCT Filed: Aug. 15, 1995

[86] PCT No.: PCT/JP95/01622

§ 371 Date: Apr. 5, 1996

§ 102(e) Date: Apr. 5, 1996

[87] PCT Pub. No.: WO96/05613

PCT Pub. Date: Feb. 22, 1996

[30] Foreign Application Priority Data

Aug. 15, 1994 [JP] Japan .................... 6-191502

[51] Int. Cl.$^6$ .................... H01L 23/48; H01L 23/52
[52] U.S. Cl. .................... 257/782; 257/700; 257/774; 257/784; 361/777; 361/808; 361/820
[58] Field of Search .................... 257/700, 701, 257/702, 782, 774, 784; 361/777, 808, 809, 820

[56] References Cited

U.S. PATENT DOCUMENTS

| 5,285,352 | 2/1994 | Pastore et al. | 257/704 |
| 5,397,917 | 3/1995 | Ommen et al. | 257/200 |

FOREIGN PATENT DOCUMENTS

61-218139  9/1986  Japan.
5-291487  11/1993  Japan.

Primary Examiner—Tom Thomas
Assistant Examiner—David Ostrowski
Attorney, Agent, or Firm—Kanesaka & Takeuchi

[57] ABSTRACT

In a semiconductor device comprising an IC chip (8) mounted on a circuit substrate (7) and sealed with a molding resin (11), corner resist films (6a, 6b, 6c, 6d) are formed at positions corresponding to a corner A of the IC chip (8) on the circuit substrate (7), and the corner A of the IC chip (8) is bonded to these corner resist films by using a die bond (9). A die pattern (3a) is exposed outside the corner resist films, and a power supply pattern (3b) is so formed to encompass their periphery. The power supply terminal, the die pattern (3a) and the power supply pattern (3b) are connected to the IC chip (8) of the corners of the IC chip is improved and peel is prevented. Furthermore, bonding of a large number of bonding wires for supplying power can be freely made.

12 Claims, 9 Drawing Sheets

| Adhesion Strength | Interface |
|---|---|
| High ←————————→ Low | Circuit Substrate - Copper Pattern |
| | Circuit Substrate - Resist |
| | Circuit Substrate - Diebond Material |
| | Resist - Diebond Material |
| | Diebond Material - Resist |
| | Copper Pattern - Resist |
| | Gold Plate - Diebond |

SEMICONDUCTOR DEVICE

This application is filed under 35 U.S.C. 371, with priority of PCT/JP95/01622 filed Aug. 15, 1995.

BACKGROUND OF THE INVENTION

1. Field of the Invention

The present invention relates to a semiconductor device which exhibits high adherence strength at the corners of the IC chip so that there is no peel at the corners even though thermal strain is concentrated at the corners and in which a power supply terminal on an IC chip and a die pattern can be freely connected without forming the die pattern by extending corresponding to the position of the power supply terminal of the IC chip. This device can be utilized in various types of electronic apparatus.

2. Description of the Prior Art

In recent years, resin-sealed semiconductor devices with a large number of electrodes have been developed in concert with the high integration of the loading of IC chips. A typical example is a pin grid array (PGA). In the PGA an IC chip is mounted on one side of a circuit substrate and sealed in resin. A plurality of pins connected to the IC chip is arranged on the other side of the circuit substrate.

Although the PGA has an advantage that it is removably mounted on the mother board, there are problems associated with the PGA inasmuch as it is difficult to reduce the size because of existence of the pins.

Accordingly, a ball grid array (BGA) has been developed as a small semiconductor device sealed in resin in place of the PGA. The structure of a normal BGA will now be explained with reference to FIG. 7.

Figure 7:
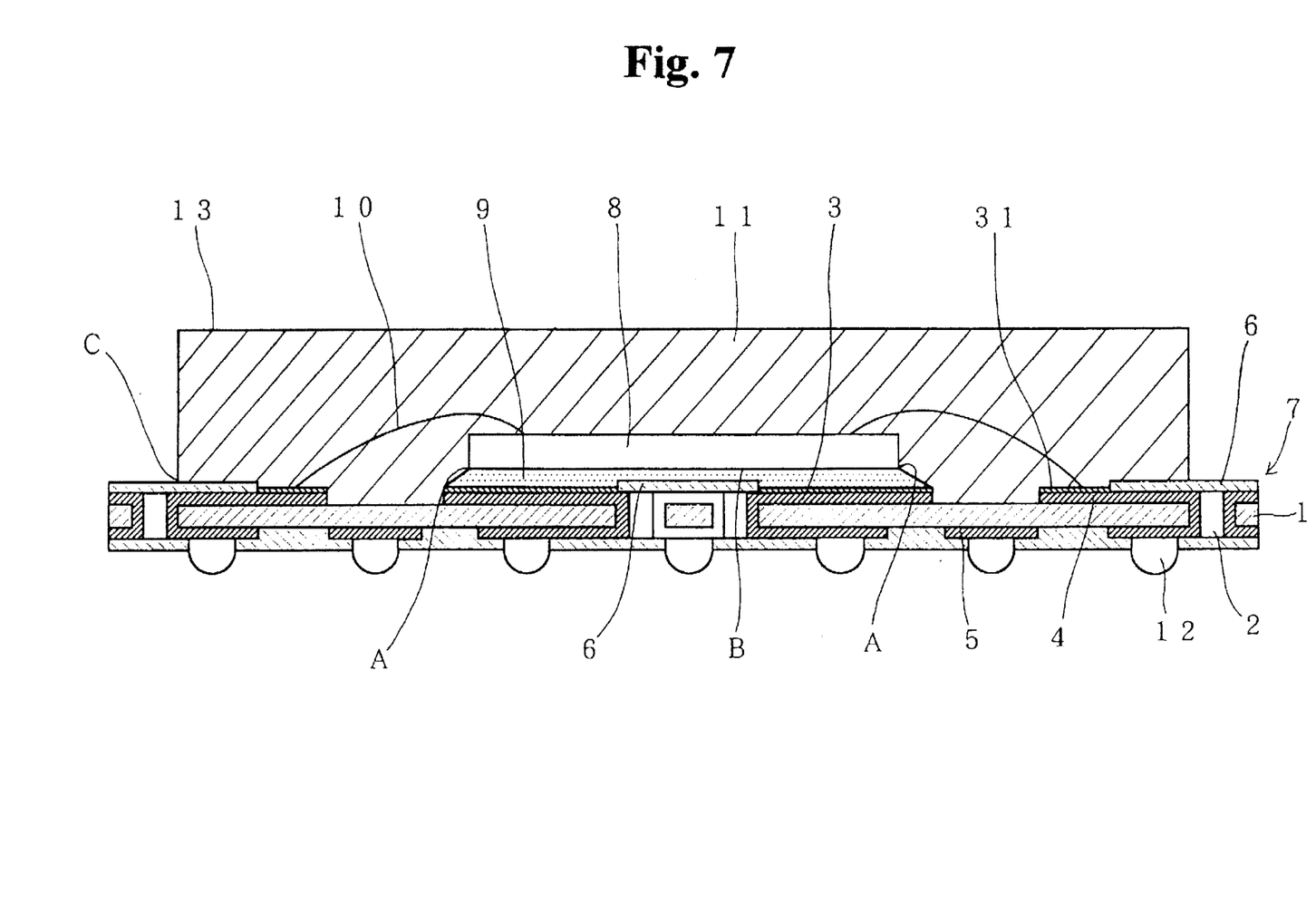
FIG. 7 is a sectional view of a conventional BGA.

FIG. 7 is a sectional view of a conventional BGA.

This BGA is produced as follows. Using a cutting drill or the like, a plurality of through-holes 2 is formed in an almost-square resin substrate 1 formed of glass-epoxy resin or the like of a thickness of about 0.2 mm covered with laminated copper foil to a thickness of 18 μm its top and bottom surfaces. Next, the surface of the substrate, including the wall surfaces of the through holes 2, is washed, after which a copper plated layer is formed by means of non-electrolytic plating and electrolytic plating on all surfaces of the resin substrate 1. At this time the copper plated layer is provided also at the inside of the through-holes 2.

Next, a laminate of plating resist (a resist used for areas not requiring plating) is provided and developed by exposure to light to form a pattern mask, after which the pattern is etched using $CuCl_2+H_2O_2$, a common circuit substrate etching liquid.

A die pattern 3 of an IC chip and a connection electrode 4 for wire bonding are formed on the upper surface of the resin substrate 1 and a pad electrode 5 on which is formed a solder bump is provided on the lower surface. The connection electrode 4 and the pad electrode 5 are connected via the through-holes 2.

Next, an approximately 2 to 5 μm nickel-plated layer is provided on the surface of the copper-plated layer of the electrode exposed on the upper and lower surfaces of the resin substrate 1. In addition, a gold-plated layer 31 of about 0.5 μm, which affords superior characteristics for connection to the bonding wire, is provided on the nickel-plated layer.

A solder resist process is next performed on specified portions to form a resist film 6. An open section for the resist film which is a surface on which it is possible to solder a plurality of identical shapes in matrix form is formed on the lower surface of the resin substrate 1, whereby a circuit substrate 7 is completed.

Next, an IC chip 8 is secured directly to the gold-plated layer 31 of the die pattern 3 on the circuit substrate 7 using an adhesive (die bond material) 9. A power supply terminal and an I/O terminal of the IC chip 8 are connected to the connection electrode 4 using a bonding wire 10. Subsequently, the IC chip 8 and the bonding wire 10 are enclosed in resin in a transfer mold using a thermosetting resin 11 to protect the IC chip 8 from light.

In addition, solder balls are supplied to the pad electrode 5 formed on the lower surface of the resin substrate 1, and solder bumps 12 are formed by heating in a heating furnace. Conductance to a pattern of a mother board substrate (omitted from the drawing) is ensured by the solder bumps 12. A BGA 13 is completed in this manner.

However, there is room for improvement in this semiconductor device. Specifically, in the BGA 13, the linear expansion coefficient of the glass epoxy resin used for sealing the resin substrate which forms the BGA 13 is 14 ppm/°C.; that of the thermosetting resin used in the molding resin 11 of the transfer mold is 16 ppm/°C.; and that of the copper pattern forming the die pattern 3 mounted on the IC chip 8 is 17 ppm/°C. The contraction ratios for these three are thus different. For this reason, the BGA 13 shown in FIG. 7 tends to be curved on the IC chip 8 side.

Figure 8:
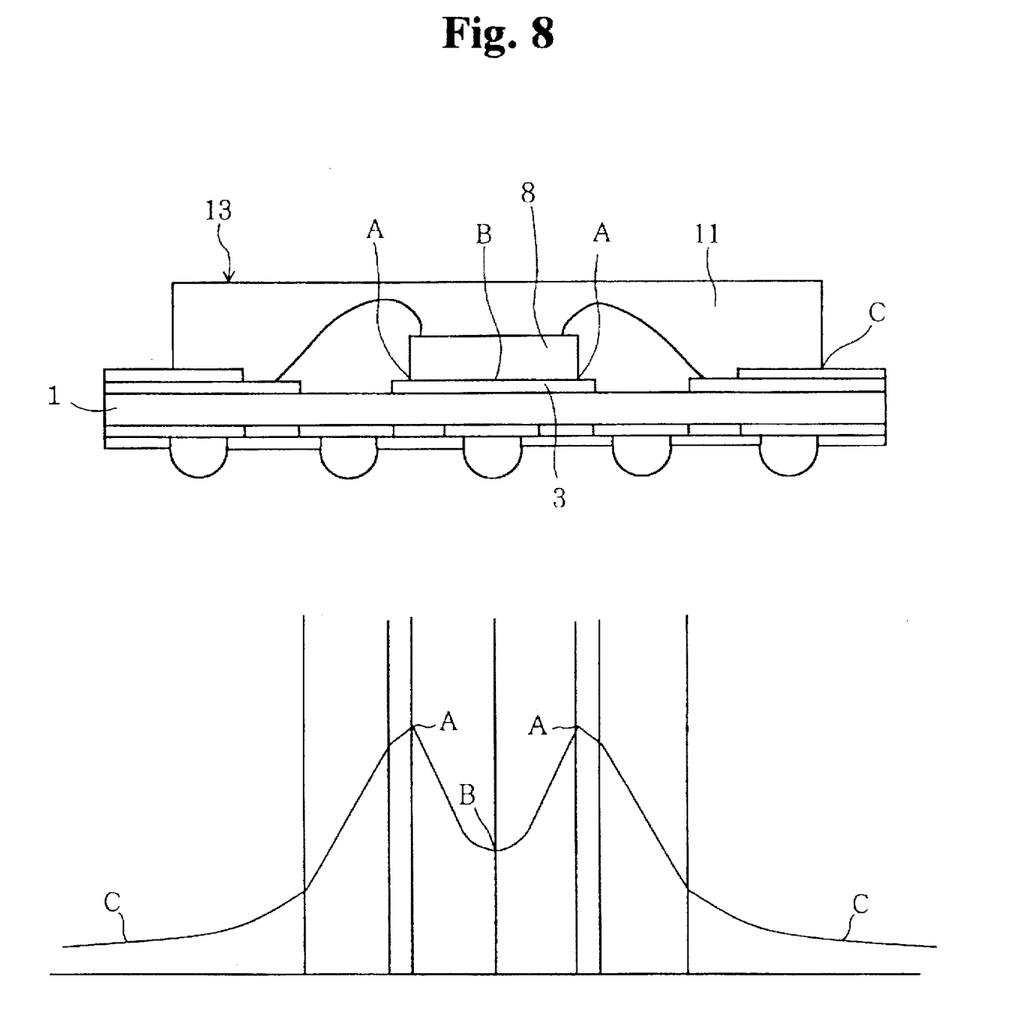
FIG. 8 is a diagram showing the stress distribution at each part of the sectional view of FIG. 7.

FIG. 8 is a stress distribution diagram for the various parts of the sectional view of FIG. 7. It can be understood from FIG. 8 that the stress from thermal deformation is concentrated at the corners A of the IC chip 8 secured to the resin substrate 1, and that this stress has its peak at the corners A of the IC chip 8 and is distributed to gradually reduce to the center B and the periphery C of the resin substrate 1. Accordingly, because of the thermal stress concentrated at the corner A, peel may occur close to the outer periphery of the IC chip 8.

Figure 9:
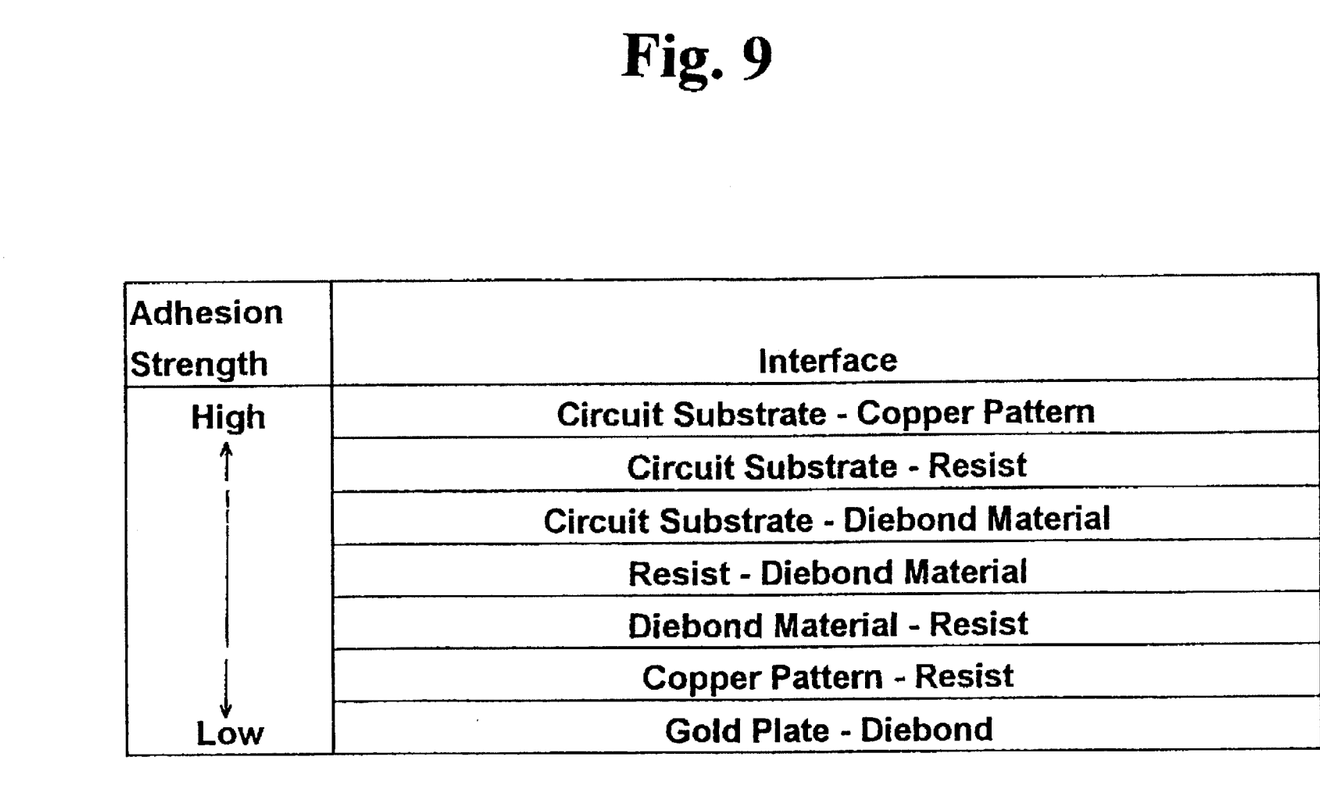
FIG. 9 is a table showing the relationship between the material and the adherence strength.

Here, the adhesion strength between respective members, as shown in FIG. 9, differs according to the objects bonded, and the adhesion strength is low in the case of diebond materials and gold-plating in particular. Specifically, as in the BGA 13 shown in FIG. 7, the adhesion strength at this part of the die bonded member is the lowest when the gold-plated layer 31 is applied to the die pattern 3. In addition, this trend becomes even greater as the size of the IC chip 8 increases with respect to the size of the package of the BGA 13.

From these reasons, defoliation tends to readily occur in the vicinity of the outer periphery of the IC chip 8 in the BGA 13 shown in FIG. 7. Therefore, cutting and the like of the bonding wire 10 occurs when the IC chip 8 is defoliated.

U.S. Pat. No. 5,077,633 discloses a semiconductor device in which the IC is mounted on an insulating material (resist) such as a polyimide film by the adhesion of a die bonding material. The technology of this semiconductor device is believed to be helpful in preventing peel of the IC chip, because the adhesion strength between the insulating material (resist) and the die bonding material is higher than the adhesion strength between the gold plating and the die bonding material, as shown in FIG. 9.

However, U.S. Pat. No. 5,077,633 proposes no means for solving the problem relating to the power supply to the IC chip in the semiconductor device. Specifically, as a result of high integration and high speed in the semiconductor device, a large number of bonding wires for power supply is necessary for a stable supply of electric power. No embodiments are disclosed in U.S. Pat. No. 5,077,633 for connecting the many bonding wires for supplying power.

On the other hand, Japanese Laid Open Patent Application 20524/1985 discloses a semiconductor device which comprises a power conducting film positioned around an IC chip between the IC chip mounting section and a lead conducting film arrangement section, and a plurality of bonding wires connecting a plurality of power supply terminals on the IC chip and the power conducting film. A stable power supply is possible with this semiconductor device because the bonding wires are freely connected between the power conducting film and the IC chip.

However, with the semiconductor device of Japanese Laid Open Patent Application 20524/1985, no technology for preventing peel of the IC chip is disclosed.

To prevent peel of the IC chip and to provide free connection of the bonding wires for supplying power are essential conditions, both of which must be satisfied at the same time in recent semiconductor devices which require both high reliability and high density integration. However, as mentioned above, conventional semiconductor devices satisfy only one of these conditions. There have been no semiconductor devices meeting both these conditions simultaneously.

Accordingly, an object of the present invention is to provide a semiconductor device which is highly reliable and capable of being highly integrated, without peel of the IC chip, and, in addition, allowing the bonding wire for the power supply to be freely connected.

DISCLOSURE OF THE INVENTION

This object of the present invention is realized by the provision of a semiconductor device comprising an IC chip sealed with a resin wherein the IC chip is mounted on a circuit substrate having a die pattern for securing the IC chip to a resin substrate and a connecting electrode for connecting a plurality of electrodes for the IC chip, wherein by that the external form of the die pattern is larger than the external form of the IC chip, an insulating film with an external form smaller than the external form of the die pattern is attached to the die pattern, and the IC chip is die bonded to the insulating film, and, further bonding wires for power supply to the IC chip are connected to a part of the die pattern exposed from the insulating film.

As a result, even though the thermal stress is concentrated at the corners because of the difference between the linear expansion coefficients of the resin substrate which makes up the semiconductor device, the molding resin, and the die pattern loaded onto the IC chip, bonding at the corners is between the insulating film and the die bond material with high adhesive power so that the corners of the IC chip exhibit no peel and the reliability of the semiconductor device is greatly improved. Also, it is unnecessary for one part of the die pattern to extend outward, corresponding to the position of the power supply terminal of the IC chip, and it is possible to freely connect the bonding wires between the die pattern and the power supply terminal. It is therefore possible to easily cope with high density integration and increased size of the IC chip.

More specifically, the die pattern of the present invention has a main pattern formed close to the center area of a position at which the IC chip is mounted, bonding patterns formed outside of the position at which the IC chip is mounted, and radially positioned combination patterns electrically connecting the main pattern and the bonding patterns; and said insulating film is attached to the inside of the bonding pattern.

With this type of structure, forming a pattern in the corner of the IC where stress is most concentrated is avoided and it is possible to improve the reliability of the IC.

DETAILED DESCRIPTION OF THE PREFERRED EMBODIMENTS

Preferred embodiments of the present invention will now be explained in detail with reference to the drawings.

Figure 1:
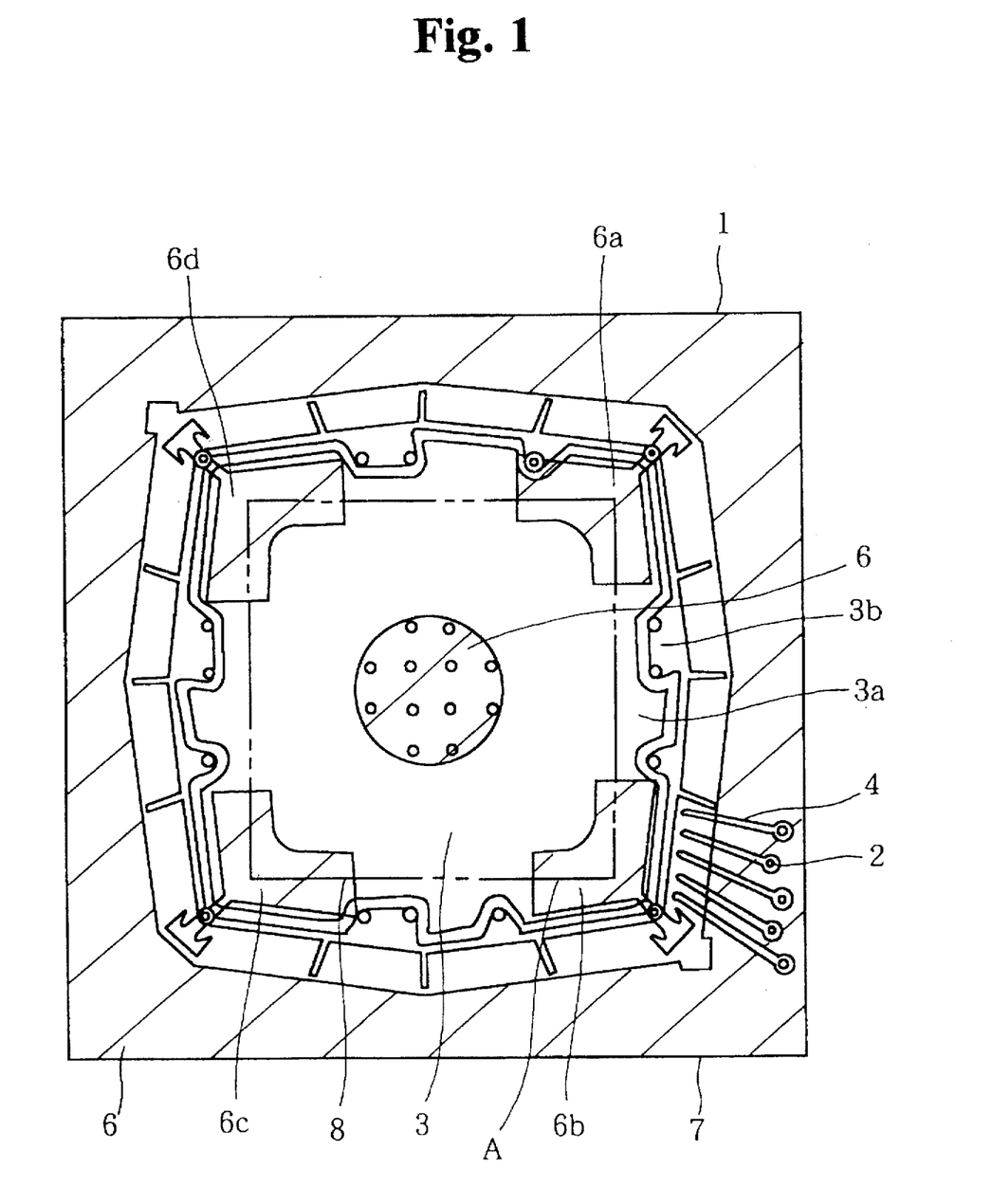
FIG. 1 is a plan view of a BGA package illustrating a first embodiment of the present invention.
Figure 2:
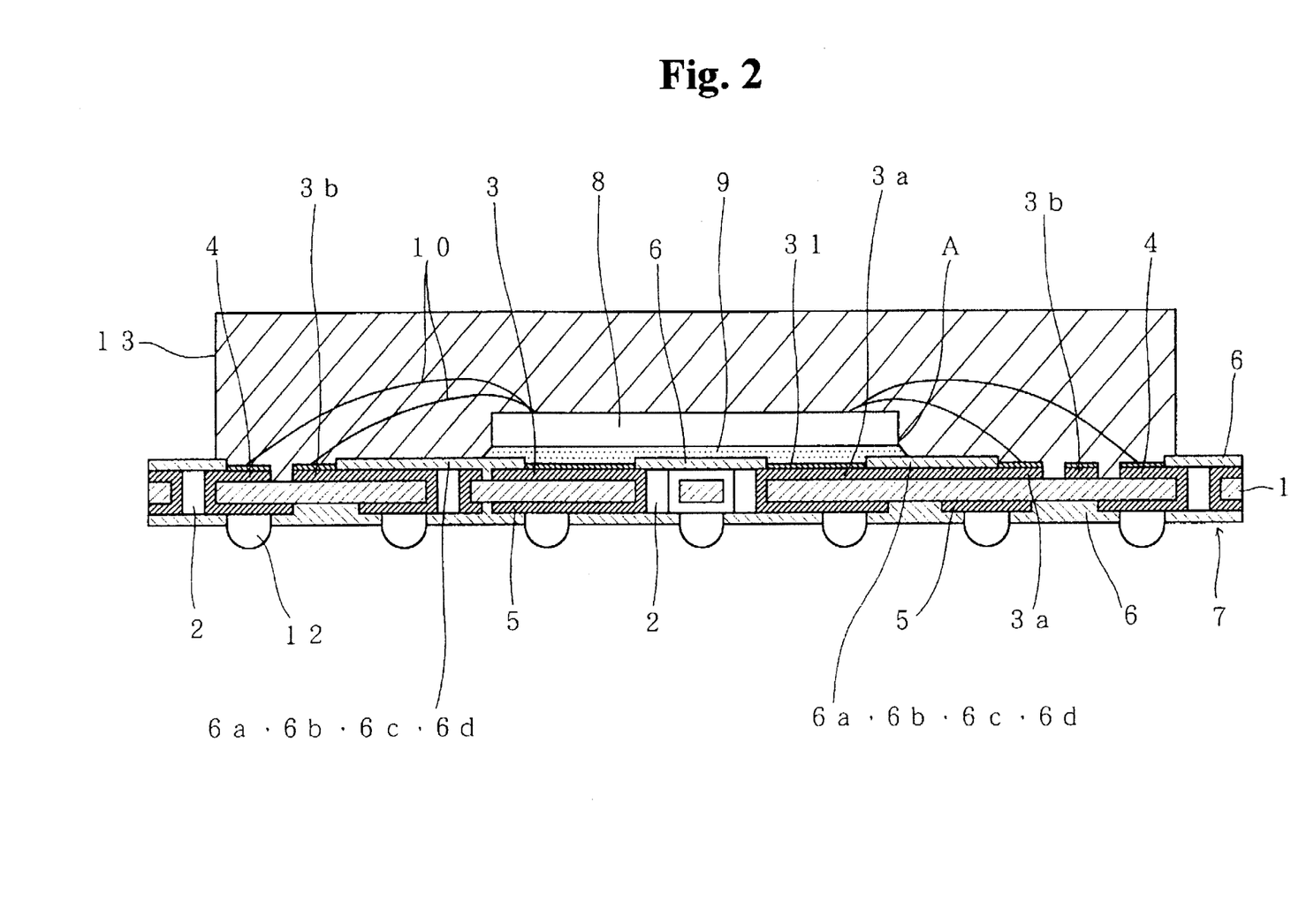
FIG. 2 is a sectional view of the principal parts of the first embodiment of the present invention shown in FIG. 1.

FIG. 1 and FIG. 2 show the configuration of a first embodiment of the present invention.

FIG. 1 is a plan view of a BGA package. FIG. 2 is a sectional view of the principal parts of the first embodiment of the present invention shown in FIG. 1. The same reference numerals designate the same members referred to in the conventional technology.

The semiconductor device of this first embodiment utilizes the conventional technology illustrated in FIG. 7 inasmuch as a thin copper foil is laminated on both sides of a resin substrate 1 and through-holes 2 are formed, after which a copper plated layer is provided by both non-electrolytic plating and electrolytic plating on all surfaces of the resin substrate 1 on both sides.

Next, a plating resist lamination is provided and developed by exposure to light to form a pattern mask, after which die patterns 3, 3a for the IC chip and a power supply pattern 3b and a lead pattern 4 are formed on the upper surface by pattern etching using an etching liquid, and pad electrodes 5 on which solder bumps are provided are formed on the lower surface. Here, the outer shapes of the die patterns 3, 3a are greater than the outer shape of the IC chip 8.

Further, the die patterns 3, 3a (Vdd) on the upper surface of the resin substrate 1, a power supply pattern 3b (Vss), and a lead pattern 4 are connected to the pad electrode 5 on the lower surface through the through holes 2.

Next, an insulating film is formed on the corner sections corresponding to at least the corner A of the IC chip 8 and on other specified parts on the die patterns 3, 3a. A development-type liquid solder resist, a thermosetting solder resist (polyimide/epoxy), or an adhesive polyimide tape, or the like can be used as the insulating film, but in this embodiment a development-type liquid solder resist film was formed using a solder resist process.

In this manner, corner resist films 6a, 6b, 6c, 6d corresponding to the corners A of the IC chip 8 and a resist film 6 on the other specified parts are applied. In this case, the outer shapes of the corner resist films 6a, 6b, 6c, 6d are smaller than the outer shapes of the die patterns 3, 3a, so that the die bond patterns 3, 3a are exposed on the periphery of the corner resist films 6a, 6b, 6c, 6d.

In addition, open sections of a plurality of same-shaped resist films 6 which have a surface on which it is possible to affix solder are formed in matrix form on the lower surface of the resin substrate 1. A circuit substrate 7 is formed in this manner.

Gold plating 31 is provided on the die pattern section to which the resist films 6a, 6b, 6c, 6d are not affixed, and on the power supply pattern and the lead pattern of the circuit substrate 7.

The IC chip 8 is then mounted on the upper surface of the circuit substrate 7. At this time, the corner sections of the IC chip 8 are bonded to the corner section resist films 6a, 6b, 6c, 6d attached to the corners A of the die pattern 3 using a die bond 9. At the same time, the center area of the IC chip 8 is directly bonded to the die pattern 3 using the die bond 9.

Next, the power supply terminal of the IC chip 8, the die pattern 3a, exposed at the outer periphery of the corner section resist films 6a, 6b, 6c, 6d, and the power supply pattern 3b which is formed outside the die pattern 3a, surrounding the die pattern 3a at certain intervals, are wire bonded using the bonding wire 10. In the same manner, the lead pattern 4 formed at the outer periphery of the circuit substrate 7 and the I/O terminal of the IC chip 8 are wire bonded using the bonding wires 10.

Subsequently, the IC chip 8 is sealed in resin by a transfer mold using a thermosetting resin 11 to protect the IC chip 8 from light.

Balls of solder are supplied to a plurality of pad electrodes 5 which are formed on the lower surface of the circuit substrate 7 and to which solder can adhere. The solder balls are then heated in a heating furnace, whereby solder bumps 12 are formed. These solder bumps 12 allow the pad electrodes 5 to be conducted to a pattern of a mother board substrate (omitted from the drawing).

A BGA 13 is completed in this manner.

When the semiconductor device is formed in this manner the corner A of the IC chip 8 is attached to the corner section resist films 6a, 6b, 6c, 6d using the die bond 9. Therefore, as shown in FIG. 9, the adhesive power is extremely high in comparison with the case of bonding on conventional gold plating via die bond.

Accordingly, even though the thermal stress is concentrated at the corner section A of the IC chip 8 due to the difference in the contraction ratios of the resin substrate 1, the copper pattern for forming the die pattern 3 on the resin substrate 1, and the molding resin 11 which seals the IC chip 8, there is no peel at the corner section A of the IC chip 8. In addition, because the internal periphery of the corner section resist films 6a, 6b, 6c, and 6d is shaped as a curve, the flow of the die bond 9 is uniform and the development of bubbles is prevented.

In addition, the external shape of the die patterns 3, 3a is greater than the external shape of the IC chip 8, and the corner section resist films 6a, 6b, 6c, and 6d are greater than the external shape of the IC chip 8 but smaller than the external shape of the die pattern 3a. Accordingly, when the die pattern 3a and the power supply pattern 3b exposed on the outer periphery of the corner section resist films 6a, 6b, 6c, and 6d, and the power supply terminal of the IC chip 8 are electrically connected by a plurality of bonding wires 10, it is possible to freely connect the power supply terminal to the die pattern 3a and the power supply pattern 3b without extending the die pattern 3a and the power supply pattern 3b to pull out these patterns corresponding to the position of the power supply terminal of the IC chip 8.

Figure 3:
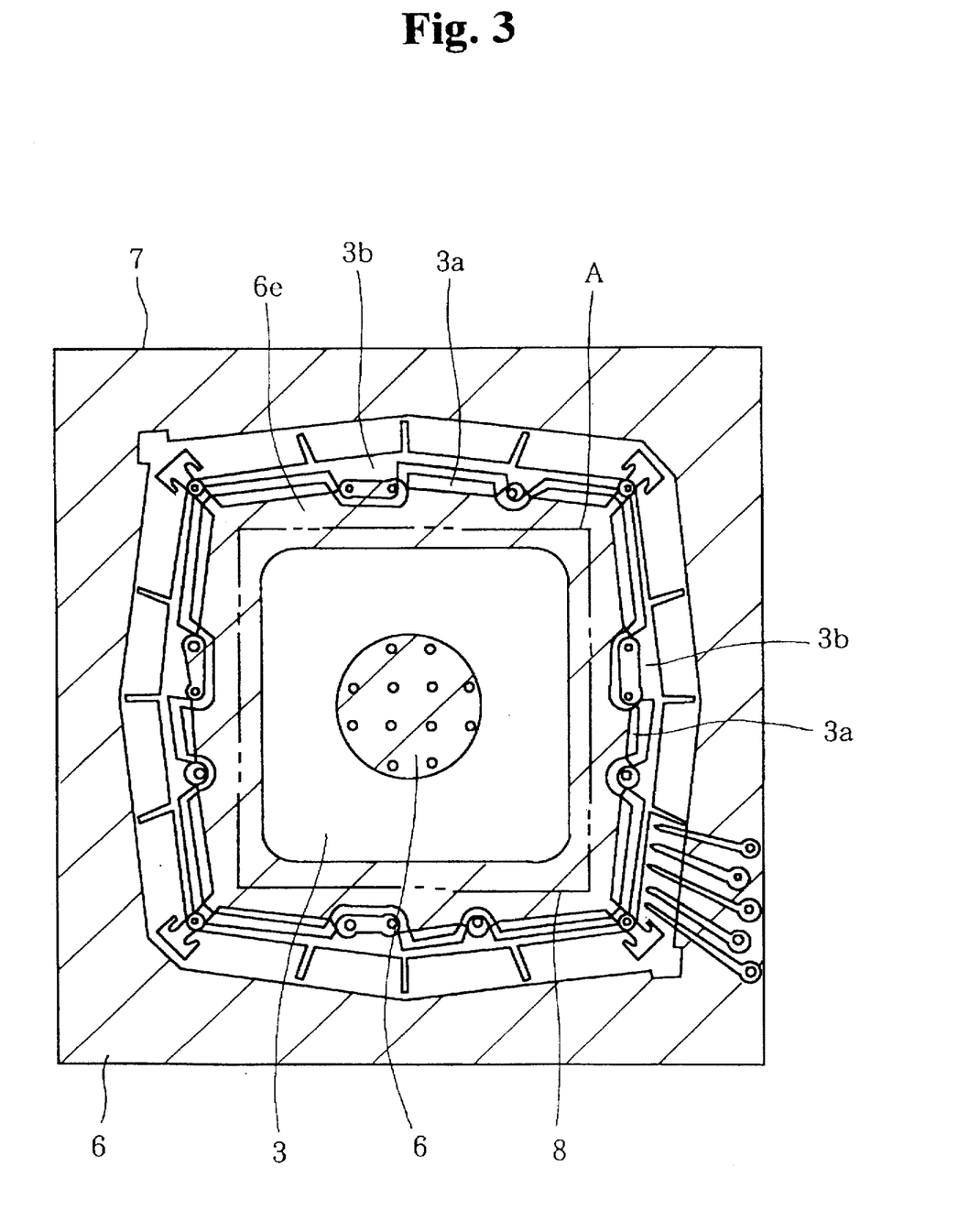
FIG. 3 is a plan view of a second embodiment of the semiconductor device of the present invention.

FIG. 3 is a plan view of a second embodiment of the semiconductor device of the present invention.

In this semiconductor device, a ring-shaped, integrally formed resist film 6e is provided in place of the corner section resist films 6a, 6b, 6c, and 6d which are independently formed in separate locations in the first embodiment. The semiconductor device of this configuration provides the same actions and effects as the first embodiment of the semiconductor device of the present invention.

Figure 4:
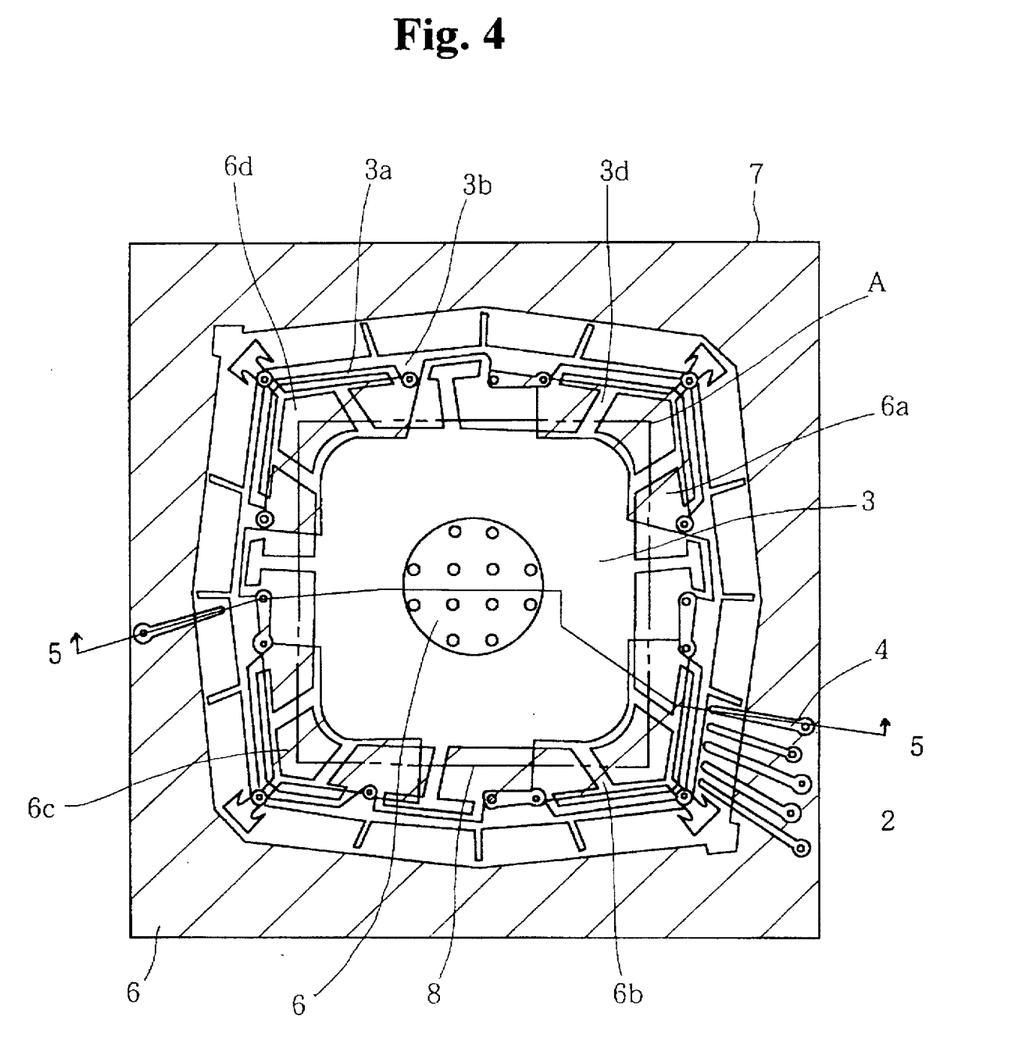
FIG. 4 is a plan view of a third embodiment of the semiconductor device of the present invention.
Figure 5:
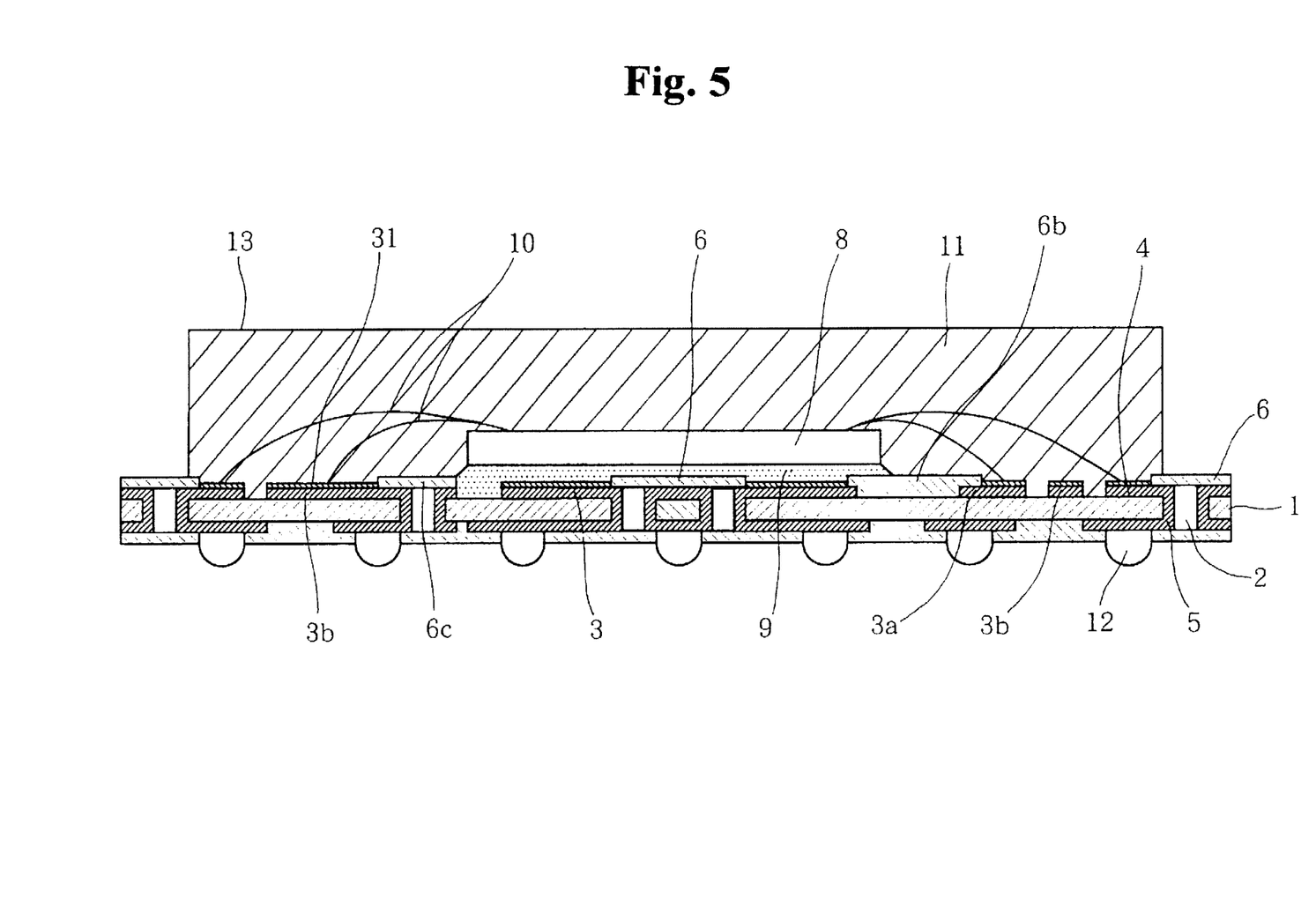
FIG. 5 is a sectional view of the principal parts of the third embodiment of the semiconductor device of the present invention shown in FIG. 4, viewed toward the line 5—5.

FIG. 4 and FIG. 5 show the configuration of a third embodiment of the present invention. FIG. 4 is a plan view and FIG. 5 is a sectional view of the principal parts of this third embodiment shown in FIG. 4, viewed at line 5—5. In this semiconductor device, a die pattern comprises a main pattern 3, bonding patterns 3a and combination patterns 3d connecting the main pattern 3 and the bonding patterns 3a.

Here, the shape of the main pattern 3 is smaller than the shape of the IC chip 8, and the bonding patterns 3a is formed at the outer periphery of the position where the IC chip 8 is mounted. The main pattern 3 and the bonding patterns 3a are electrically connected by the combination patterns 3d. The combination patterns 3d are formed in a radial configuration extending from the main pattern 3 and are not positioned at the corner section A of the IC chip 8 at which the thermal stress is concentrated.

Power supply patterns 3b are provided around the periphery of the die patterns 3a surrounding these patterns with a certain interval.

A resist film is applied to a part almost at the center of the main pattern 3 and at positions corresponding to each corner section A of the IC chip 8 in almost the same manner as in the first embodiment. Specifically, the corner section resist films 6a, 6b, 6c, and 6d formed at each corner section are independently attached at specific locations, and the resist film 6 is attached to the center area of the main pattern 3. As a result, overall, one part of the main pattern 3 is exposed, and the region in which the combination patterns 3d are formed is covered by the corner section resist films 6a, 6b, 6c, and 6d.

Also in this semiconductor device the power supply terminal of the IC chip 8 is electrically connected to the die patterns 3a and the power supply patterns 3b by the bonding wire 10.

By means of the semiconductor device with this configuration, the corner section A of the IC chip 8 where thermal deformation mainly develops is attached by die bonding to the resist with a comparatively high adhesion strength. At the same time, the combination patterns 3d are arranged so as not to position at the corner A, thereby alleviating generation of thermal deformation due to a difference in the thermal contraction ratio. As a result, peel of the corner section A of the IC chip 8 is reliably prevented, and the reliability of the semiconductor device is improved.

Also, because the peripheral section of the IC chip 8 other than the corner section A is directly attached to the circuit substrate 1 by the die bond material 9, the adhesion strength is high and reliability is considerably increased.

In the case where the power supply terminal of the IC chip 8 is electrically connected by the bonding wires 10, the power supply terminal can be freely connected to the die pattern 3a and the power supply pattern 3b without extending the die patterns 3a and the power supply patterns 3b by pulling out these corresponding to the position of the power supply terminal of the IC chip 8.

Figure 6:
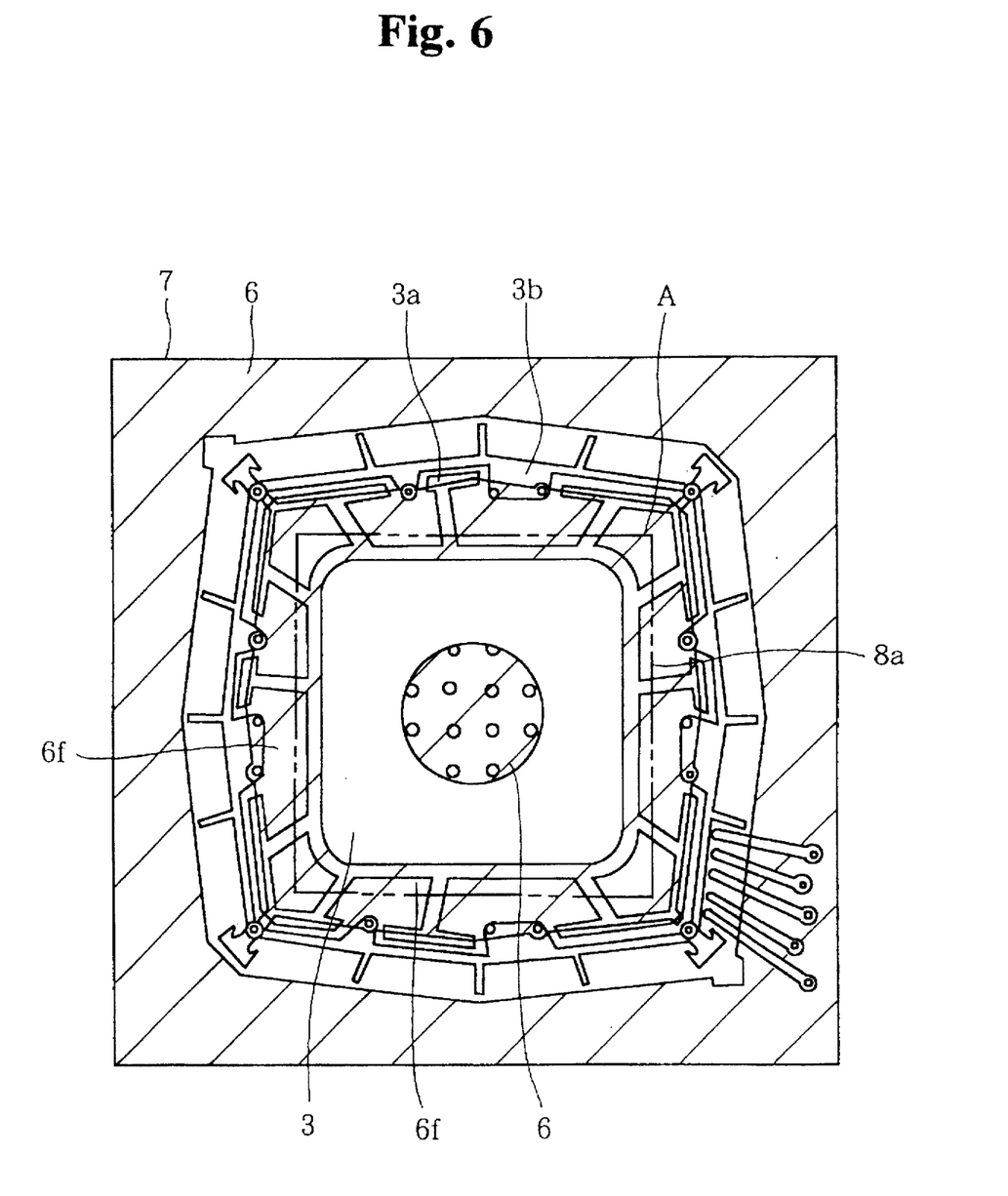
FIG. 6 is a plan view of a fourth embodiment of the semiconductor device of the present invention.

FIG. 6 is a plan view of a fourth embodiment of the semiconductor device of the present invention.

In this semiconductor device, in place of the corner section resist films 6a, 6b, 6c, and 6d independently formed at specific locations in the third embodiment, these corner section resist films are integrally formed as a ring-shaped resist film 6f. The semiconductor device of this configuration provides the same actions and effects as the third embodiment of the semiconductor device of the present invention.

The above explanation was given with reference to a BGA semiconductor device, but the present invention can be applied to other semiconductor devices such as, for example, a pin grid array (PGA).

INDUSTRIAL APPLICABILITY

The semiconductor device of the present invention with the above-mentioned configuration can be built into various types of electrical apparatus.

We claim:

1. A semiconductor device comprising:

a resin substrate, an IC chip to be disposed on the resin substrate and having an outer bottom shape with corner portions and a plurality of electrodes, a circuit substrate mounted on the resin substrate, said circuit substrate including a die pattern for securing the IC chip onto the resin substrate, said die pattern having an outer shape greater than the outer bottom shape of the IC chip, and a connecting electrode for connecting the electrodes of the IC chip, an insulating film having an outer shape smaller than that of the die pattern, said insulating film being disposed on the die pattern at a portion at least corresponding to the corner portions of the IC chip, said IC chip being die bonded to the insulating film, and bonding wires connected between the IC chip and a part of the die pattern exposed from the insulating film.

2. A semiconductor device as claimed in claim 1, wherein said bonding wires supply power to the IC chip.

3. A semiconductor device as claimed in claim 1, wherein said corners of the IC chip are located inside the insulating film.

4. A semiconductor device as claimed in claim 1, wherein said die pattern has a center area and outer areas without being covered by the insulating film, said center and outer areas having gold plating thereon.

5. A semiconductor device as claimed in claim 1, wherein said die pattern comprises: a main pattern formed in a center area of a position at which the IC chip is mounted, bonding patterns formed outside of the position at which the IC chip is mounted, and combination patterns electrically connecting the main pattern and the bonding patterns; and said insulating film is situated between the main pattern and the bonding pattern.

6. A semiconductor device as claimed in claim 5, wherein said bonding patterns are positioned outside four sides of the main pattern to surround the main pattern; and said combination patterns are arranged radially from the main pattern to the bonding patterns.

7. A semiconductor device as claimed in claim 6, wherein said combination patterns are arranged at a section outside of the corner portions of the IC chip.

8. A semiconductor device as claimed in claim 6, wherein said insulating film is formed in a circular shape for substantially covering the region at which the combination patterns are formed.

9. A semiconductor device as claimed in claim 6, wherein said insulating film is formed so as to cover a section corresponding to the corner portions of the IC chip in the region at which the combination patterns are formed.

10. A semiconductor device as claimed in claim 5, wherein said insulating film is attached so that one part of the main pattern is exposed therefrom.

11. A semiconductor device as claimed in claim 5, wherein said insulating film is a plating resist and gold plating is applied on the die pattern which is not covered with the plating resist.

12. A semiconductor device as claimed in claim 11 wherein said plating resist is a developing-type liquid solder resist.

* * * * *